US006987306B2

(12) United States Patent
Fathimulla et al.

(10) Patent No.: US 6,987,306 B2
(45) Date of Patent: Jan. 17, 2006

(54) MONOLITHIC PHOTORECEIVER TECHNOLOGY FOR FREE SPACE OPTICAL NETWORKS

(75) Inventors: Ayub M Fathimulla, Ellicott City, MD (US); Olaleye A. Aina, Columbia, MD (US); Harry Stephen Hier, Sykesville, MD (US)

(73) Assignee: Epitaxial Technologies, Baltimore, MD (US)

( * ) Notice: Subject to any disclaimer, the term of this patent is extended or adjusted under 35 U.S.C. 154(b) by 82 days.

(21) Appl. No.: 10/621,203

(22) Filed: Jul. 17, 2003

(65) Prior Publication Data

US 2005/0012106 A1    Jan. 20, 2005

(51) Int. Cl.
*H01L 27/14* (2006.01)
(52) U.S. Cl. ............... 257/431; 257/432; 257/436; 257/443; 257/444; 257/80; 257/82
(58) Field of Classification Search ............... 257/431, 257/432, 436, 443, 444, 80, 82, 83, 84
See application file for complete search history.

(56) References Cited

U.S. PATENT DOCUMENTS

| | | | | |
|---|---|---|---|---|
| 5,266,794 A | * | 11/1993 | Olbright et al. ...... | 250/214 LS |
| 5,414,726 A | * | 5/1995 | Raj et al. ...................... | 372/26 |
| 5,684,308 A | * | 11/1997 | Lovejoy et al. ............. | 257/184 |
| 5,689,122 A | * | 11/1997 | Chandrasekhar ............ | 257/184 |
| 6,001,664 A | * | 12/1999 | Swirhun et al. ............. | 438/31 |
| 6,538,808 B1 | * | 3/2003 | Tastavridis .................. | 359/344 |
| 6,784,466 B2 | * | 8/2004 | Chu et al. .................... | 257/194 |

\* cited by examiner

*Primary Examiner*—Nathan J. Flynn
*Assistant Examiner*—Remmon R. Fordé
(74) *Attorney, Agent, or Firm*—H. C. Lin

(57) ABSTRACT

This invention describes an approach for monolithically integrating all the components of a photoreceiver—optical amplifier, optical band-pass filter, and photodiode module—on a single chip. The photoreceiver array employs unique optical amplifier and conversion technologies that provides the ultra-sensitivity required for free space optical communications networks. As an example, by monolithically integrating a vertical cavity surface emitting laser-diode (VCSEL) optical preamplifier with a photodiode receiver and related amplifiers and filters on the same chip, sensitivities as low as −47 dBm (62 photons/bit at 2.5 Gb/s), along with an order of magnitude reduction in size, weight, and power consumption over comparable commercial-off-the-shelf (COTS) components can be demonstrated. In accordance with another aspect of the present invention, the concept of monolithic integration of optical amplifier with photodetector is extended to lasers, another amplifier and modulators covering ultra violet to very long wavelength infrared using the InP, GaAs, GaSb, InAs, InSb, SiGe, SiC and GaN etc based technologies.

14 Claims, 11 Drawing Sheets

$$F_N \text{ (dB)} = F_{N1} + (F_{N2} - 1)/G_1 + \ldots\ldots$$
$$G \text{ (dB)} = G_1 + G_2 + G_3 + \ldots\ldots\ldots$$

| | OPTICAL AMPLIFIER | OPTICAL CONVERTER | BUFFER AMPLIFIER | |
|---|---|---|---|---|
| RECEIVED POWER (dBm) | -47 | -17 | | |
| GAIN (dB) | 30 | | 20 | |
| CONVERSION GAIN (V/W) | | 2500 | | |
| OUTPUT POWER (dBm) | -17 | | | |
| OUTPUT SIGNAL | | | 5.0 $V_{pp}$ | |

|   | DEVICE-I | DEVICE-II | MONOLITHIC CIRCUIT |
|---|---|---|---|
| 1 | VCSOA | PIN-Diode | Receiver |
| 2 | VCSOA | Any DETECTOR | Receiver |
| 3 | VCSOA | VCSOA | High gain Optical Amplifier |
| 4 | VCSOA | VCSEL | High Power Optical Source |
| 5 | VCSOA | EO/EA Modulator | Efficient Optical Modulator |

TABLE 1

MONOLITHIC PHOTORECEIVER TECHNOLOGY FOR FREE SPACE OPTICAL NETWORKS

BACKGROUND OF THE INVENTION (1) Field of the Invention

The present invention relates to monolithic photoreceiver technology.

(2) Brief Description of Related Art

The next logical extension to the Internet is a free space mobile digital data network that is pervasive and can meet both commercial telecommunications' need for ubiquitous connectivity and need to provide the war-fighters with assured and secure information anywhere, at any time, and in the right form, using an extensible communication architecture that assures maximum connectivity among the current terrestrial networks, the battlefield, aircraft, spacecraft, Unmanned Vehicles (UAVs), ships and submarines. Of all the candidate technologies, free space mobile optical communications is considered the most likely to enable the highest data rate, longest range and highest sensitivity.

To achieve connectivity to other terminals in the theater and the needed bit rate of greater than 2.5 Gb/s, the notional free space mobile optical data network will require powerful and efficient optical transmitters at the basic physical layer level, as well as ultra-sensitive photo-receivers. Widespread deployment of such a network will require paradigm shifts in the development and production of optical networking devices and components that will minimize size, weight, power and system cost, while meeting all network link performance requirements.

Free Space Optics (FSO), also known as Optical Wireless communication has become a viable, high bandwidth solution to, fiber optic, millimeter wave wireless and RF technologies. The main disadvantage of FSO is atmospheric attenuation, which is weather dependent. Therefore, in order to address the atmospheric attenuation either link distance or link budget has to be compromised. Increasing the link budget will not be cost effective and also increases the size, weight and power (SWaP). A more practical solution which would extend the link distance keeping the link budget constant or increase the link budget keeping the link distance constant would be to develop ultra-sensitive receiver technology. For example, the potentially incident optical radiation can be as low as −40 dBm (100 nW), the notional network requires photoreceivers with sensitivities as low as −47 dBm[1]. Although there have reportedly been bench level demonstrations of direct detection photo-receivers employing erbium doped fiber amplifier (EDFA) technology that have comparable performance, there are no compact, affordable, and commercially available photo-receivers that will meet these requirements[2,3].

SUMMARY OF THE INVENTION

An object of the present invention is to implement a compact monolithic photoreceiver that is capable of near quantum limit sensitivities operating with a BER of $10^{-9}$ up to 40 Gb/s bit rate. Another object of the present invention is to implement a compact monolithic photoreceiver that is capable of −47 dBm sensitivity operating with a BER of $10^{-9}$ at 2.5 Gb/s bit rate. Another object of this invention is to optimize the design and performance of a monolithic phototranceiver.

The object is achieved by monolithically integrating all the components of a photoreceiver-optical amplifier, optical band-pass filter, and photodiode module-on a single chip. The photoreceiver and arrays employs unique optical amplifier and conversion technologies that provides the ultra-sensitivity required for free space optical communications networks. This sensitivity is achieved by monolithically integrating a vertical cavity surface emitting laser-diode (VCSEL) optical preamplifier with an resonant tunneling bipolar transistor (RTBT) optical converter that enables the realization of photodiode receiver and related amplifiers and filters on the same chip, resulting in sensitivities as low as −47 dBm (62 photons/bit at 2.5 Gb/s), along with an order of magnitude reduction in size, weight, and power consumption over comparable commercial-off-the-shelf (COTS) components.

In accordance with another aspect of the present invention, different devices such as PIN photodiode, base-collector junction of heterojunction bipolar transistor (HBT) as photodiode, Avalanche photodiode, and resonant cavity enhanced photodiode and quantum well infrared photodetectors (QWIP) etc instead of RTBT can be used as the photo detector In accordance with still another aspect of the present invention, the photo detectors can be combined with HBT for realization of the monolithic photoreceiver on a single substrate.

In accordance with yet another aspect of the present invention, a monolithic high power optical source or array of sources can be realized by integrating vertical cavity semiconductor optical amplifier (VCSOA) with VCSELs having a single pixel or arrays. The VCSELs comprises either a single wavelength or multiple wavelengths.

In accordance with yet another aspect of the present invention, a monolithic high gain semiconductor optical amplifier or amplifier arrays can be realized by integrating VCSOA with another VCSOA having a single pixel or arrays.

In accordance with yet another aspect of the present invention, a monolithic highly efficient either electro-optic (EO) or electro-absorption (EA) modulator with gain can be realized by integrating modulators with VCSOA.

In accordance with yet another aspect of the present invention, the concept of monolithic integration of optical amplifier with photo detector, laser, another amplifier and modulator covering ultra violet to very long wavelength infrared can be implemented in InP, GaAs, GaSb, InAs, InSb, SiGe, SiC and GaN etc based technologies

DETAILED DESCRIPTION OF THE INVENTION

In the following sections, we present the concept and design of the photoreceiver, showing performance variations with design parameters. We also present performance achieved thus far and the expected performance when the monolithic photoreceiver is optimized.

(1) Photoreceiver Concept

Figure 1:
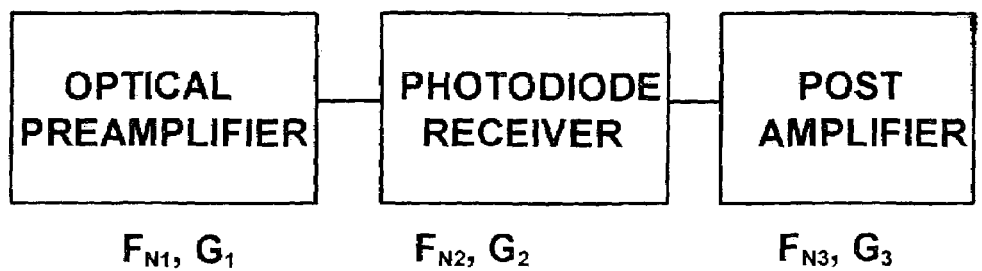
FIG. 1 shows a typical pre-amplified photoreceiver block diagram.

The concept of pre-amplified photoreceivers is well established, having been applied to produce the most sensitive optical receivers to date. Its effectiveness is based on the fact that when amplifiers are cascaded as shown in FIG. 1, the gain is additive, while the noise figure depends directly on the noise figure and inversely as the gain of the $1^{st}$ stage. This provides maximum flexibility in designing ultra low noise photoreceivers since the front end ($1^{st}$ stage) can be optimized for minimum noise performance which also translates into-moderate gain. Subsequent stages can then be optimized for high gain to achieve the required sensitivity requirements. With this approach, near quantum limit sensitivities have been achieved. However, current solutions, involving the combination of photodiode receivers and erbium doped optic fiber amplifiers or in-line semiconductor optical amplifiers (SOAs) are bulky, power hungry, polarization sensitive and costly. Further, these approaches require critical alignment of fiber to couple light and an external filter to minimize the extraneous radiations.

Figure 2:
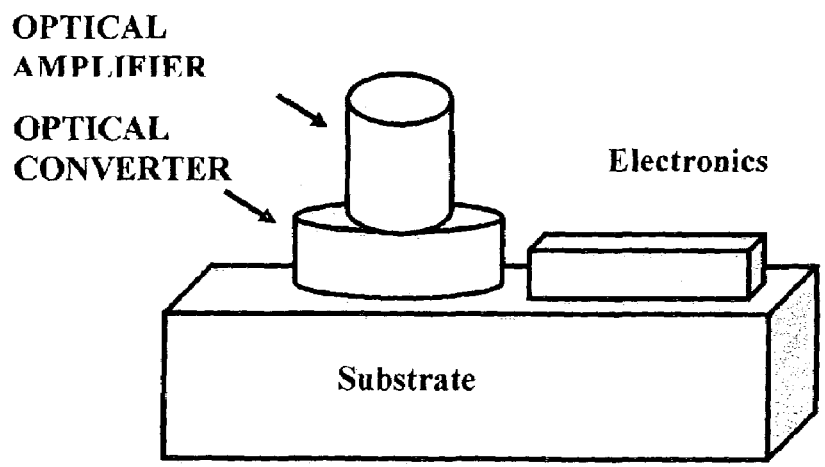
FIG. 2 shows the sketch of a monolithic photoreceiver chip.

We have devised an approach for implementing compact ultra-sensitive photoreceivers that involves the monolithic integration of optical preamplifiers based on vertical cavity surface emitting lasers (VCSELs) and optical converters based on the resonant tunneling bipolar transistor (RTBT), together with required additional amplifiers and decision circuitry. FIG. 2 shows an "artist eye view" of such a monolithic photoreceiver chip. As shown here, the ultra-sensitive photoreceiver is in the opto-electronic (O-E) configuration for direct connection to standard digital systems. With minor modifications, it can also be designed in the opto-electronic-optical (O-E-O) configuration or in the all optical (O-O) configuration for direct connection to legacy optic fiber networks. In addition, a conventional photoreceiver can also be implemented by modification the process without the optical amplifier and with an optical converter such as RTBT.

(2) Optical Preamplifier

Figure 3A:
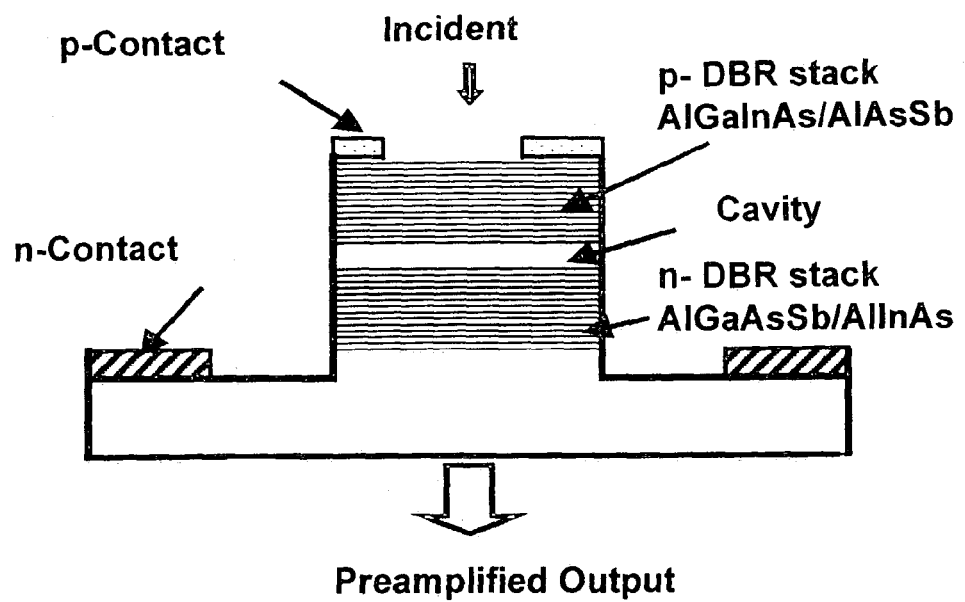
FIGS. 3a and 3b show respectively a typical structure and performance of long wavelength VCSELs.
Figure 3B:
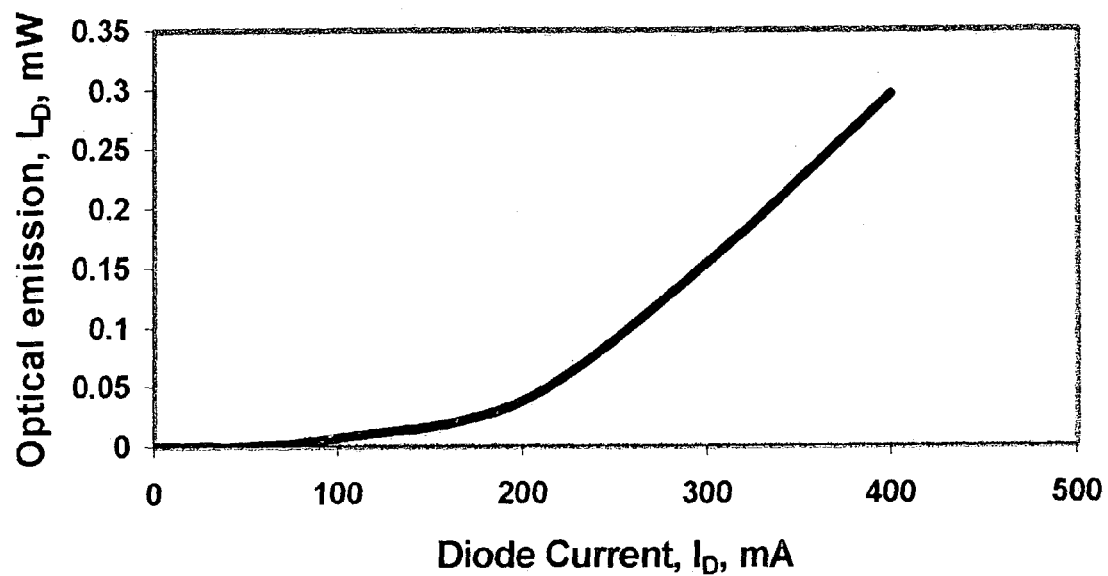

The optical preamplifier (VCSOA) is based on our long wavelength VCSEL technology that uses antimony based distributed Bragg reflector (DBR) mirrors and AlGaInAs/GaInAs active layers that is designed to minimize total device thickness and mirror resistances as shown in FIG. 3a. The layers are stacked on a semi-insulating substrate with n-contact in the order of: n-DBR stack of AlInAs (InP)/AlGaAsSb, a cavity, p-DBR stack of AlGaInAs (GaInAsP)/AlAsSb, and p-contact, upon which light is incident. The mirror stacks can also be selected from lattice matched or non-lattice matched compounds and can be grown, evaporated or bonded. Shown in FIG. 3b, this VCSEL operate at 1.55 μm and is most suitable for monolithically integrating an optical amplifier with an optical converter with minimal size and power consumption. The P-DBR stack will form an integrated filter to eliminate the effect of radiation outside the spectral pass band. Applied as an optical amplifier, the VCSEL is a Fabry-Perot amplifier. The Faby-Perot cavity is formed between the two DBRs with the active layer in the center of the cavity. The gain and bandwidth of the VCSEL amplifier is therefore given by the standard equations for Fabry-Perot amplifiers [4,5]

$$G = \frac{(1-R_{in})(1-R_{out})G_s}{\left(1 - G_s\sqrt{R_{in}R_{out}}\right)^2} \quad (1)$$

$$BW = \frac{C}{2\pi L}\text{Sin}^{-1}\left[\frac{\sqrt{(1-R_{in})(1-R_{out})}\,G^{\frac{1}{2}}}{2(R_{in}R_{out})^{\frac{1}{4}}}\right] \quad (2)$$

where $R_{in}$ and $R_{out}$ are the input and output DBR reflectivities respectively, $G_s$ is the single pass gain, C is the velocity of light in the cavity and L is the cavity length. The input and output DBR reflectivities are characterized by the mirror periods, thicknesses and compositions and are given by:

$$R = \left\{\frac{(1-bqp^{(2m-1)})}{[1+bqp^{(2m-1)}]}\right\}^2 \quad (3)$$

where m is the period of the mirror, p is the low-to-high refractive index ratio of the two mirror layers, q and b are similar ratios for the mirror entry and exit respectively. The design model takes into consideration the fact that all the above parameters are dependent on recombination effects, absorption coefficients and the wavelength.

Figure 4A:
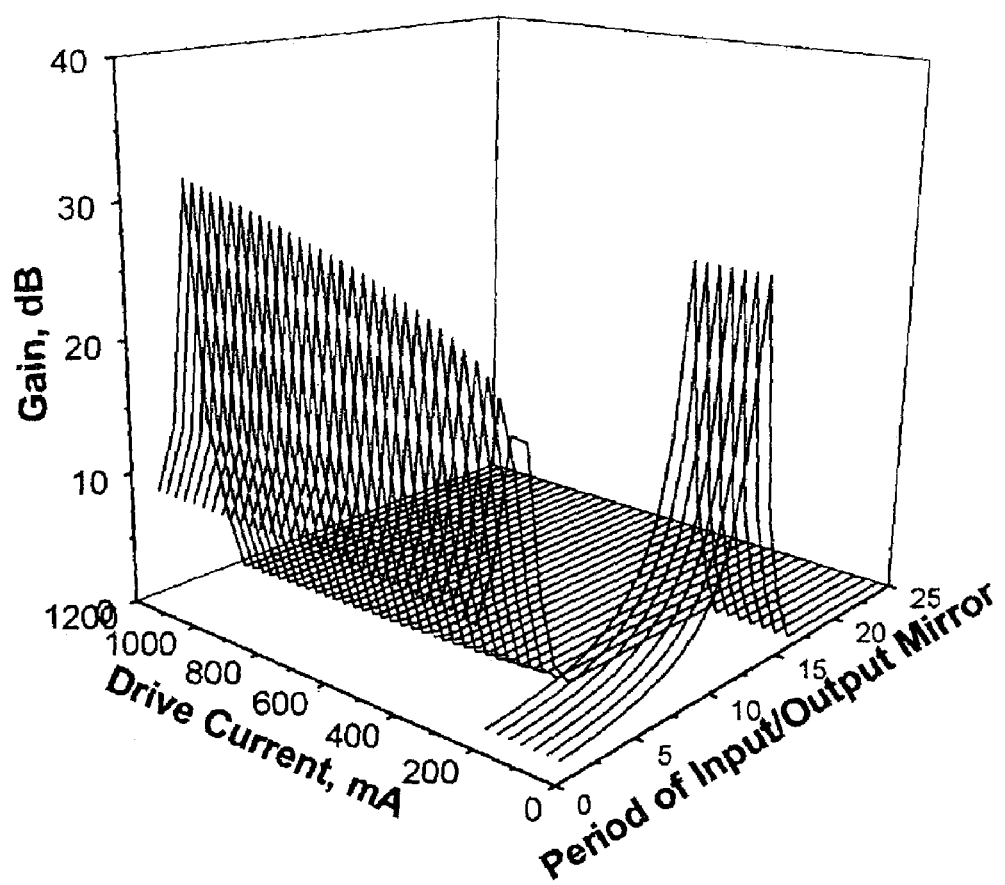
FIGS. 4a and 4b show simulation variations of VCSOA performance with key design parameters.
Figure 4B:
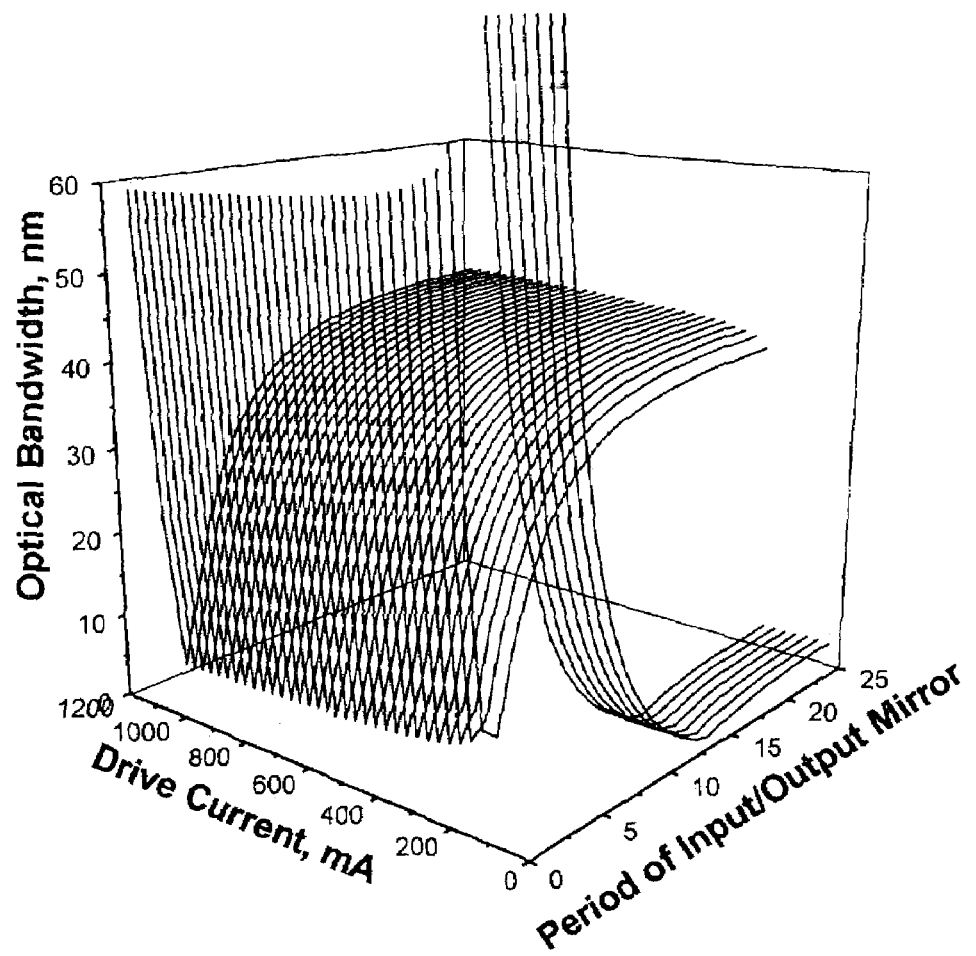

The key optical amplifier design parameters are the number of DBR periods and the current drive. When minimized, the former facilitates monolithic integration because of reduced layer thicknesses. The latter obviates the need for bulky heat sinks for the photoreceiver. A goal of the photoreceiver design was to determine the conditions for maximum gain and minimum bandwidth and noise figure with respect to these parameters. The VCSOA can be operated in either transmission of reflective mode. FIGS. 4a and 4b shows the optimization contours determined with equations 1 & 2 showing how devices using thin mirrors and operating at low currents can be produced. With a 30 mA bias current for a 15 μm diode, only 12 periods of the DBR are required to achieve optical gains as high as 30 dB and bandwidths as low as 0.6 nm. By increasing the bias current to 300 mA, fewer mirror stacks as low as 5 need to be used with a slight gain penalty. Therefore, the VCSOA design can be optimized to achieve the maximum gain, high power saturation, with minimum noise and operating requirements. The simulated results shown are for VCSOA operating in transmission mode, similar device optimization can be achieved for reflective mode VCSOA.

(3) Optical Converter

Figure 5:
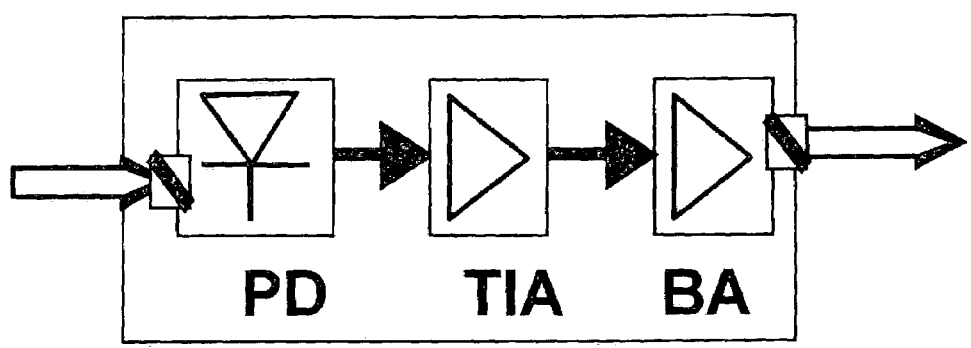
FIG. 5 shows block diagram of optical converter.
Figure 6A:
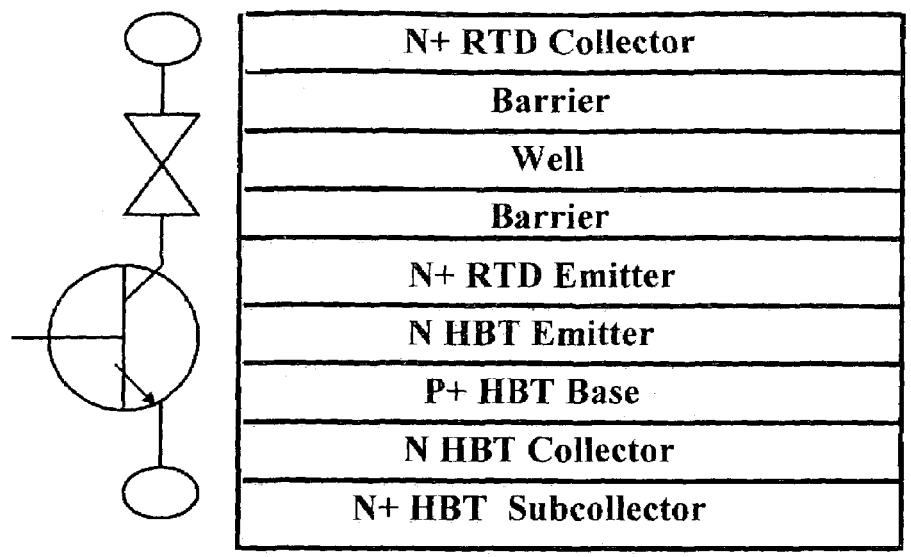
FIG. 6a shows RTBT device structure.
Figure 6B:
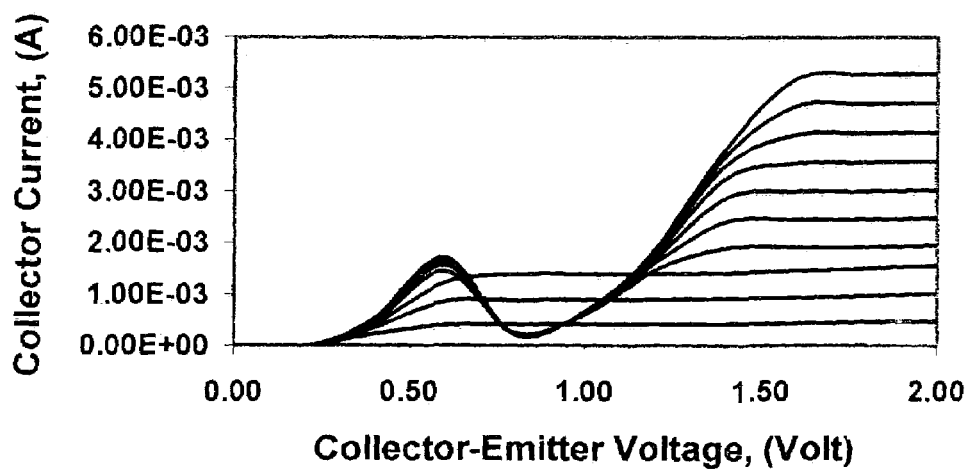
FIG. 6b, characteristics.

The block diagram of the optical converter is shown in FIG. 5. It is a cascaded combination of a photodetector (PD), a transimpedance amplifier (TIA) and a buffer amplifier (BA). The optical converter is based on our RTBT device technology. The RTBT is a multifunction device that is a combination of a resonant tunneling diode (RTD) and a heterojunction bipolar transistor (HBT) as shown. It is capable of three-terminal optical and electronic positive and negative resistance and gain. FIGS. 6a and 6b show respectively the cross section of a generic RTBT material structure as well as the I–V characteristics of the device. The RTBT material structure can be optimized to have high positive and negative gain with high cut-off frequencies, $F_T$. We have selected the InP-HBT, because it is the most widely used device in a variety of high performance monolithic optical, microwave, mm-wave, and ultra-high-speed digital and analog integrated circuits. The use of GaInAs material for the collector of RTBT, offers the option to use the base-collector junction for the formation of the photodiode. Further the RTBT structure having a GaInAs collector can be also be used as a phototransistor with high gain. The RTD characteristics can be used to design clocks, oscillators, mixers and switches. The HBT characteristic of the RTBT will be utilized to design the trans-impedance and buffer amplifiers, which in combination with photodiode and decision circuits constitutes an integrated receiver. The advantage of this approach is that both the devices can be grown in one step avoiding a re-growth process. In addition, the RTBT can be used to design millimeter wave monolithic integrated circuits (MMICs) such as VCOs, mixers, power amplifiers and buffer amplifiers on InP substrate. The MMIC process can be integrated into the optical converter process, thereby both optical and mm-wave transmit/receive (T/R) chip can be demonstrated using a single RTBT structure.

(4) Monolithic Photoreceiver

Figure 7:
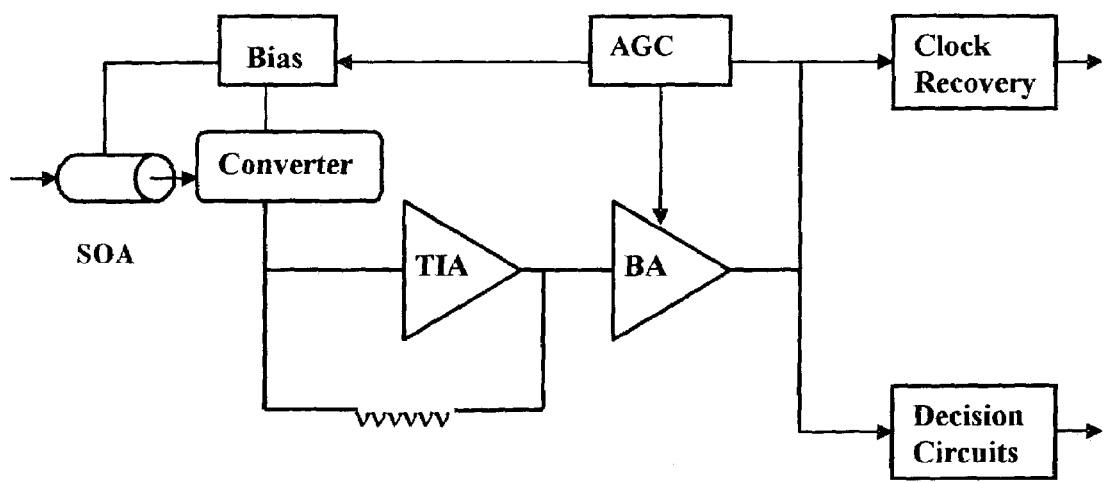
FIG. 7 shows the block diagram of the optical receiver system.
Figure 8:
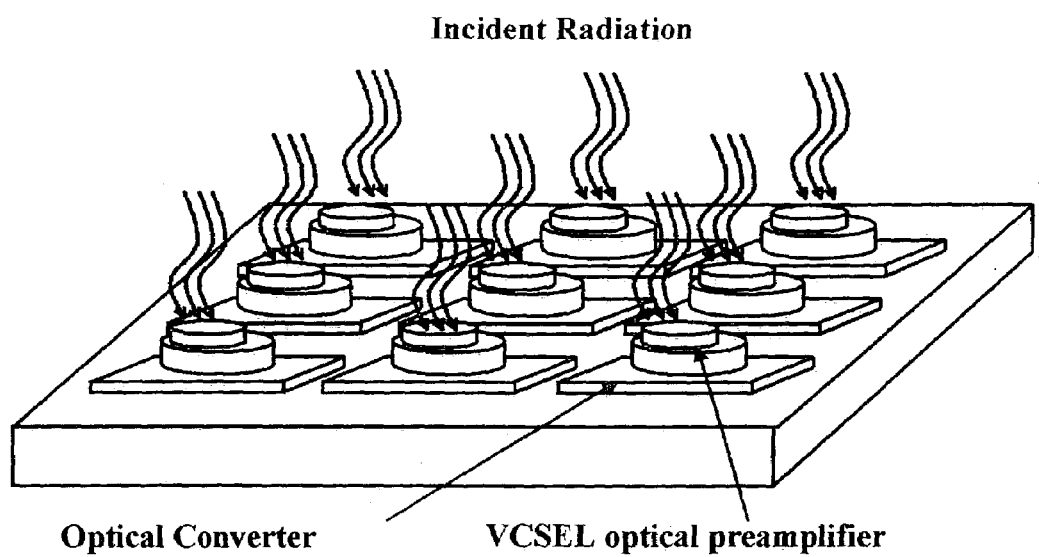
FIG. 8 shows the sketch of a monolithic photoreceiver array.

The implementation of the monolithic photoreceiver by integrating the optical preamplifier and optical converter described in the previous sections is shown in FIG. 7. In the proposed receiver, the fabrication is totally monolithic and is achieved by vertical integration whereby all the layers are grown in one material structure. The complexity of the fabrication process is reduced because the VCSOA layers are thinner than normally used for such devices. Alternatively, the integration is achieved by bonding the optical preamplifier and optical converter wafers. In either case, a monolithic photoreceiver operating in the frequencies of 40 GHz and above having ultrasensitivity is achieved In another aspect of the invention is to implement the monolithic photoreceiver sensor array using the arrays of the optical converter as shown in the FIG. 8. In the figure each pixel consisting of VCSOA and photodetector is integrated with TIAs and buffer amplifiers respectively. In accordance with yet another aspect of the present invention is either to connect all the pixels or row (columns) of the pixels to TIAs and buffer amplifiers. In the arrays, the pixel diameter is at least 25 μm with a 25 μm pitch to accommodate pixel interconnections. This type of layout will result in a 50% fill factor. By using a three-dimensional integration approach, higher fill factors of 70–100% can be achieved. The field of view (FOV) of each pixel will depend on the acceptance angle of the DBR mirrors at the input and output of the optical preamplifier. From the variation of DBR reflectivity with the angle of incidence of the optical input, we estimate that the minimum field of view will be at least 15° per pixel (comparable to the beam divergence of a typical VCSEL). The FOV of the array will be much higher than this. An excessively high FOV is not desirable for a photoreceiver since the dynamic range will be degraded. In the photoreceiver, the FOV will also be limited through the use of a lensed window and an appropriate aperture in its packaging.

Figure 9:
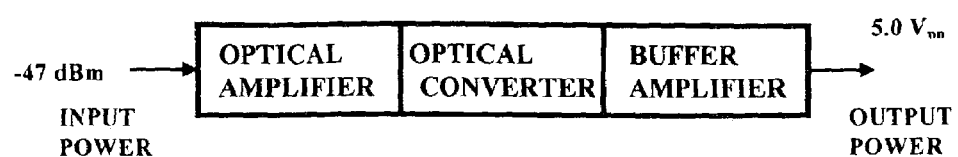
FIG. 9 shows photoreceiver link budget

The photoreceiver sensitivity can be estimated from the block diagram and link budget shown in FIG. 9. A receiver optical input of −47 dBm is amplified by 30 dB by the optical preamplifier to a −17 dBm light signal. The optical converter then converts this to a 0.05 Vpp voltage. The buffer amplifier stage provides another 20 dB gain to yield a 5 Vpp output bit stream. Therefore the sensitivity of the photoreceiver is −47 dBm. Provisions can be made to incorporate automatic gain control (AGC) at the optical preamplifer or optical converter level to enhance photoreceiver linearity at the highest received power levels.

Figure 10:
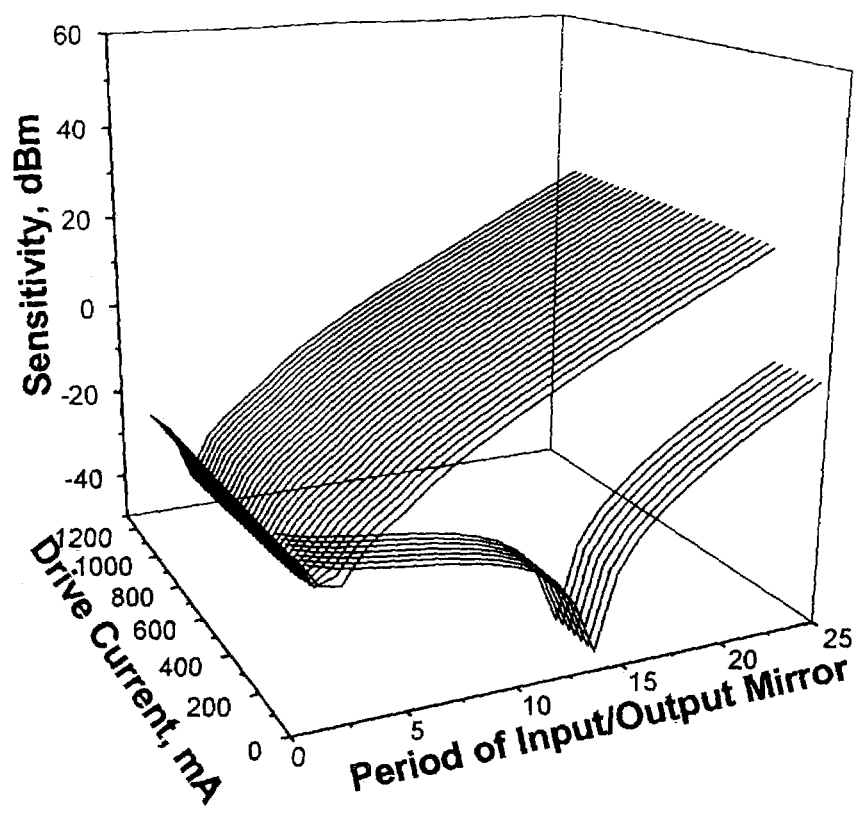
FIG. 10 shows simulated sensitivity of monolithic photoreceiver.

To determine the trade space of the photoreceiver as a function of device and component parameters, we note that the sensitivity in milliwatt decibel units (dBm) is given by[4]:

$$S = 10\log\left[\frac{10^3 hc}{\lambda} QBW\left(N_{F1} + \frac{N_{F2}}{G_1}\right)\right] \quad (4)$$

where Q=6 for a BER of $10^{-9}$, h is Planck's constant, c is the velocity of light, λ is the wavelength, BW is the optical bandwidth as defined in equation 2, $N_{F1}$ and $G_1$ are the noise figure and gain of the optical preamplifier and $N_{F2}$ is the noise figure of the optical converter. The variation of the simulated sensitivity as a function of design and operational parameters is shown in FIG. 10. Minimum sensitivity of −47.5 dBm is achievable for moderate mirror periods suitable for monolithic integration. This conforms to the estimated sensitivity derived from the link budget shown in FIG. 9.

(5) Modulator and Other Devices

Figure 11:
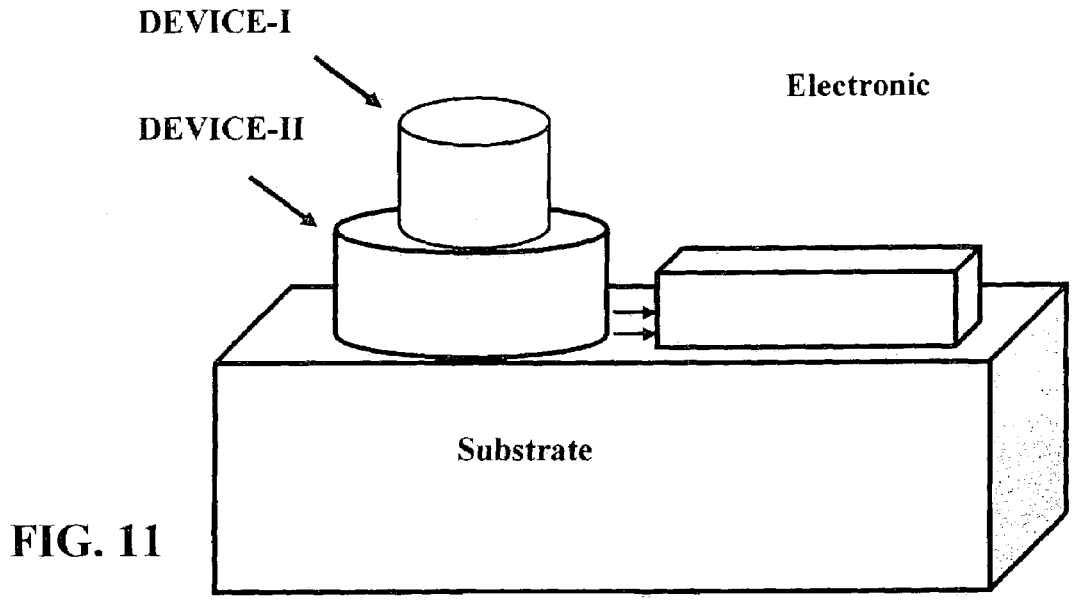
FIG. 11 shows the block diagram of monolithic integration of VCSOA with other devices

While the RTBT as three terminal phototransistor or base-collector junction of the RTBT in the foregoing description is used as an optical converter, different devices such as PIN photodiode, Avalanche photodiode (APD), resonant cavity enhanced photodiode and quantum well infrared photodetectors (QWIP) etc can be used as detector. These devices can be combined with the HBT either vertically or by selective epi growth for realization of the monolithic photoreceiver. Although only the use of semiconductor optical amplifier for ultra-sensitive monolithic photoreceiver has been described, the SOA may also be combined with other types of optical devices such as VCSELs, EO/EA modulators, and other SOAs as shown in the FIG. 11 and Table 1. These devices are integrated with SOA as single structure using wafer bonding or vertical growth for applications such as efficient modulator, high power optical source and high optical gain amplifiers respectively.

In another embodiment of the present invention is that, an array of monolithic high gain semiconductor optical amplifier, efficient modulators and optical sources can be realized by integrating VCSOA with another VCSOA, modulator and VCSEL respectively. In accordance with yet another aspect of the present invention, a monolithic high power optical source or array of sources can be realized by integrating vertical cavity semiconductor optical amplifier (VCSOA) with VCSELs having a single pixel or arrays. The VCSELs comprises either a single wavelength or multiple wavelengths.

Although only the use of InP based material systems and ultra-sensitive monolithic photoreceiver operating in wavelength of 1.55 μm has been described, the concept can be extended to other material structures such as GaAs, GaSb, GaN, SiGe, SiC etc. covering ultra violet (UV) to very long wavelength infrared (VLWIR) wavelength range. However, for monolithic photoreceiver operating in wavelength greater than 2.5 μm, dielectric DBR may need to be used to minimize the total thickness of the VCSOA layers.

(6) Conclusion

In conclusion, we have described the concept and design of an ultra sensitive monolithic photoreceiver that combines a VCSEL optical preamplifier with an RTBT optical converter in a totally monolithic approach that enables the realization of photoreceiver arrays. The monolithic photoreceiver is capable of sensitivities as low as −47 dBm at a BER of $10^{-9}$ and a bit rate of 2.5 Gb/s. The photoreceiver concept and the monolithic integration approach are extendable to higher bit rates and longer wavelengths. Similarly, the VCSOA can also be monolithically integrated with VCSEL and EO/EA modulators.

While the preferred embodiments of the invention have been described, it will be apparent to those skilled in the art that various modifications can be made in the embodiments without departing from the spirit of the present invention. Such modifications are all within the scope of this invention.

What is claimed is:

1. A monolithic optically pre-amplified photoreceiver, comprising
    a common substrate;
    vertically integrated vertical cavity surface emitting lasers (VCSEL) as optical preamplifier; and
    vertically integrated optical converters and
    monolithically integrated Trans-impedance Amplifier (TIA), control and decision circuits using Resonant Tunneling Bipolar Transistor (RTBT).

2. The monolithic photoreceiver as described in claim 1, wherein said optical converters are selected from the group of: PIN diode, resonant cavity enhanced photodiode (RCE); an a avalanche photo diode (APD); PIN diode formed using base collector junction of the heterojunction bipolar transistor; a heterojunction phototransistor; resonant tunneling diode embedded in intrinsic layer of PIN diode; and a QWIP.

3. The monolithic photoreceiver as described in claim 1, wherein said optical converter is integrated with TIA, control and decision circuits.

4. The monolithic photoreceiver concept and the integration approach as described in claim 1, wherein said optical preamplifier and optical converter are integrated using wafer bonding, selective epitaxial, vertical epitaxial techniques.

5. The monolithic photoreceiver concept and integration approach as described in claim 1, wherein said optical preamplifier and optical are integrated using other material structures based on the group consisting of InP, GaAs, GaSb, InAs, InSb, AlAs, AlSb, GaN, AlN, SiGe, Si and SiC technologies.

6. The monolithic photoreceiver as described in claim 1, wherein said optical converter comprises a photodetector (PD), a transimpedance amplifier (TIA) and a buffer amplifier (BA).

7. The monolithic photoreceiver concept and in integration approach a described in claim 1, wherein said optical preamplifier and optical converter are integrated using wafer bonding, selective epitaxial, vertical epitaxial techniques.

8. The monolithic receiver as described in claim 1, wherein top Distributed Bragg Reflector (DR) stacks of said optical preamplifier act as an integrated filter.

9. The monolithic photoreceiver as described in claim 1, further comprising monolithic photoreceiver array, comprising:
    a vertically integrated array of said optical preamplifier (VCSOA); and
    a vertically integrated array of optical converters.

10. The monolithic photoreceiver array as described in claim 9, wherein said array is formed by integrating arrays of VCSOAs and optical converters.

11. The monolithic photoreceiver array as described in claim 9, wherein said array is either a single or multiple wavelengths.

12. The monolithic photoreceiver array as described in claim 9, wherein said array is integrated with a single TIA, control and decision circuits.

13. The monolithic photoreceiver array as described in claim 9, wherein said each pixel in the array is integrated with TIA, control and decision circuits.

14. The monolithic photoreceiver as described in claim 9, wherein said each row in the array is integrated with TIA, control and decision circuits.

* * * * *